(12) United States Patent
Lee et al.

(10) Patent No.: US 9,865,833 B2
(45) Date of Patent: Jan. 9, 2018

(54) ORGANIC LIGHT-EMITTING DEVICE

(71) Applicant: SAMSUNG DISPLAY CO., LTD., Yongin, Gyeonggi-Do (KR)

(72) Inventors: Jae-Goo Lee, Yongin (KR); Young-Mo Koo, Yongin (KR); Min-Woo Lee, Yongin (KR); Woo-Sik Jeon, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 751 days.

(21) Appl. No.: 14/249,123

(22) Filed: Apr. 9, 2014

(65) Prior Publication Data

US 2015/0115231 A1 Apr. 30, 2015

(30) Foreign Application Priority Data

Oct. 29, 2013 (KR) ........................ 10-2013-0129558

(51) Int. Cl.
  *H01L 51/50* (2006.01)
  *H01L 27/28* (2006.01)
  (Continued)

(52) U.S. Cl.
  CPC ........ *H01L 51/5004* (2013.01); *H01L 51/006* (2013.01); *H01L 51/5218* (2013.01); *H01L 2251/55* (2013.01)

(58) Field of Classification Search
  None
  See application file for complete search history.

(56) References Cited

U.S. PATENT DOCUMENTS

2007/0120474 A1   5/2007  Kubota et al.
2007/0231596 A1*  10/2007 Spindler ............. H01L 51/5052
                                                           428/690
(Continued)

FOREIGN PATENT DOCUMENTS

JP   2008-41925 A   2/2008
JP   2009-48892 A   3/2009
(Continued)

OTHER PUBLICATIONS

Tsuji et al. "Benzo[b]phosphole sulfides. Highly electron-transporting and thermally stable molecular materials for organic semiconductor devices" 2009, Journal of Materials Chemistry Issue 21, 2009.*

(Continued)

*Primary Examiner* — Seahvosh Nikmanesh
*Assistant Examiner* — Xiaoming Liu
(74) *Attorney, Agent, or Firm* — Lewis Roca Rothgerber Christie LLP

(57) ABSTRACT

An organic light-emitting device having a resonance structure includes a substrate; a first electrode and a second electrode on the substrate and facing each other; an emission layer between the first electrode and the second electrode; a first hole transport layer between the first electrode and the emission layer; and a second hole transport layer between the first hole transport layer and the emission layer. An electron mobility of the second hole transport layer is 5 times to 100 times greater than an electron mobility of the first hole transport layer, and a thickness of the second hole transport layer corresponds to a resonance distance of a wavelength of emission light of the emission layer.

17 Claims, 4 Drawing Sheets

(51) Int. Cl.
*H01L 51/54* (2006.01)
*H01L 51/52* (2006.01)
*H01L 51/00* (2006.01)

(56) References Cited

U.S. PATENT DOCUMENTS

| | | | |
|---|---|---|---|
| 2008/0030129 A1 | 2/2008 | Aratani et al. | |
| 2008/0284324 A1* | 11/2008 | Chun | H01L 27/3211 313/504 |
| 2009/0051275 A1 | 2/2009 | Kobayashi et al. | |
| 2011/0233604 A1* | 9/2011 | Ikeda | H01L 51/5016 257/103 |
| 2011/0278558 A1* | 11/2011 | Hamada | H01L 51/5088 257/40 |

FOREIGN PATENT DOCUMENTS

| | | |
|---|---|---|
| JP | 2009-049223 A | 3/2009 |
| KR | 10-2007-0055412 A | 5/2007 |
| KR | 10-0829761 B1 | 5/2008 |

OTHER PUBLICATIONS

Shen et al. "Mobility-Dependent Charge Injection into an Organic Semiconductor" Apr. 23, 2001, Phys. Rev. Lett. 86, 3867.*
Liu et al., "Charge mobility of mixed organic semiconductors: a NPB-AlQ3 study", Dec. 5, 2006, Organic Light Emitting Materials and Devices X, 63331R.*
Cusumano et al. "Space Charge and Carrier Trapping Effects on the Transient Photocurrents of Organic Materials Using the Time-of-Flight Technique" Mar. 2008, Journal of Electronic Materials , vol. 37, Issue 3, pp. 231-239.*
Liu et al. "Charge mobility of mixed organic semiconductors: a NPB-AlQ3 study" Organic Light Emitting Materials and Devices X, 63331R (Dec. 5, 2006).*
Cusumano et al. "Space Charge and Carrier Trapping Effects on the Transient Photocurrents of Organic Materials Using the Time-of-Flight Technique" Journal of Electronic Materials Mar. 2008, vol. 37, issue 3, pp. 231-239.*
Tsuji et al. "Benzo[b]phosphole sulfides. Highly electron-transporting and thermally stable molecular materials for organic semiconductor devices" Journal of Materials Chemistry Issue 21, 2009 pp. 3364-3366.*

* cited by examiner

ORGANIC LIGHT-EMITTING DEVICE

CROSS-REFERENCE TO RELATED APPLICATION

This application claims priority to and the benefit of Korean Patent Application No. 10-2013-0129558, filed on Oct. 29, 2013, in the Korean Intellectual Property Office, the entire content of which is incorporated herein by reference.

BACKGROUND

1. Field

One or more aspects according to embodiments of the present disclosure relate to an organic light-emitting device, for example, an organic light-emitting device having a microcavity structure or a resonance structure.

2. Description of the Related Art

Organic light-emitting devices include a material that self-emits light when a voltage is applied thereto, and have high brightness, high contrast ratios, large viewing angles, high response speeds, and low driving voltage, and are capable of producing full-color images.

An organic light-emitting device includes an organic emission layer between an anode and a cathode. When voltage is applied, holes from the anode and electrons from the cathode flow into the organic emission layer. The holes and electrons move toward the cathode and the anode, respectively, while causing electron-exchange between adjacent molecules in the organic emission layer. When electrons and holes are re-combined in a molecule, excitons having an excited state may be formed. When the excitons return to a ground state, light is emitted. To increase luminescent efficiency of an organic light-emitting device, an emission layer is used together with an electron injection layer, an electron transport layer, a hole injection layer, a hole transport layer, or the like.

Organic light-emitting devices may produce full-color images by using regularly arranged color sub-pixels and microcavity effects. It is beneficial to improve driving voltage in a structure for using microcavity effects.

SUMMARY

One or more aspects according to embodiments of the present disclosure provide an organic light-emitting device having a microcavity structure for the prevention (or reduction) of a decrease in driving voltage.

According to one embodiment, an organic light-emitting device having a resonance structure includes: a substrate; a first electrode and a second electrode on the substrate and facing each other; an emission layer between the first electrode and the second electrode; and a second hole transport layer between the first hole transport layer and the emission layer; an electron mobility of the second hole transport layer being 5 times to 100 times greater than an electron mobility of the first hole transport layer, and a thickness of the second hole transport layer corresponding to a resonance distance of a wavelength of emission light of the emission layer.

According to another embodiment, an organic light-emitting device including a first pixel region, a second pixel region, and a third pixel region, and having a resonance structure, includes: a substrate; an emission layer between the first electrode and the second electrode and including a first emission layer of the first pixel region, a second emission layer of the second pixel region, and a third emission layer of the third pixel region; a first hole transport layer between the first electrode and the emission layer; and a second hole transport layer between the first hole transport layer and the emission layer and including a first pixel-second hole transport layer in the first pixel region and a second pixel-second hole transport layer in the second pixel region, an electron mobility of the second hole transport layer being 5 times to 100 times greater than an electron mobility of the first hole transport layer.

BRIEF DESCRIPTION OF THE DRAWINGS

These and/or other aspects will become apparent and more readily appreciated by reference to the following description of certain embodiments when considered together with the accompanying drawings in which.

DETAILED DESCRIPTION

Figure 1:
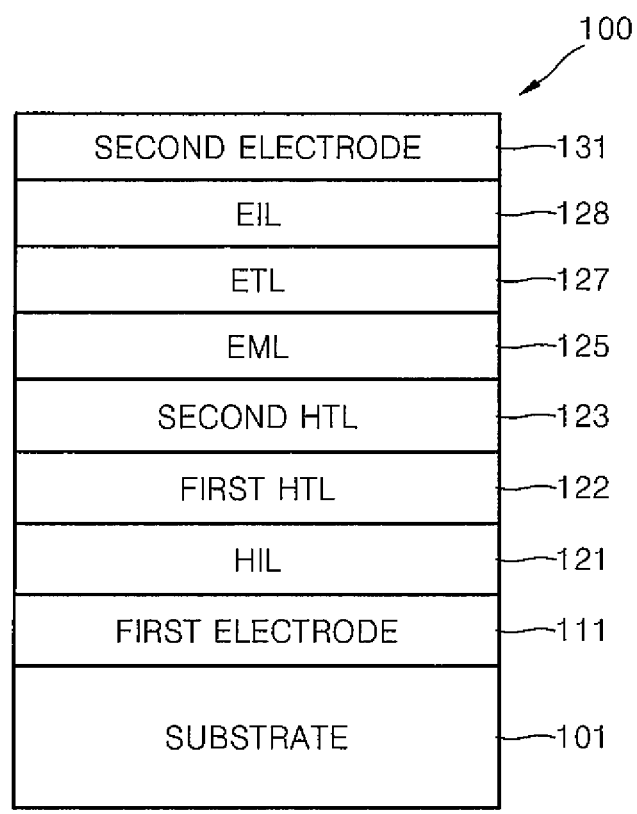
FIG. 1 is a schematic cross-sectional view of an organic light-emitting device according to an embodiment of the present disclosure.

Reference will now be made to certain embodiments, examples of which are illustrated in the accompanying drawings, where like reference numerals refer to like elements throughout. As those of ordinary skill in the art would recognize, the described embodiments may be modified in many different ways and, therefore, should not be construed as limiting. Accordingly, the embodiments are described below, by referring to the figures, merely to explain aspects of the present disclosure. Expressions such as "at least one of," when preceding a list of elements, modify the entire list of elements and do not modify the individual elements of the list. In the drawings, thicknesses of layers and regions may be exaggerated for illustrative purposes only. Throughout the specification, like reference numerals denote like elements. Also, in the context of the present application, when a first element is referred to as being "on" a second element, it can be directly on the second element or be indirectly on the second element with one or more intervening elements therebetween.

FIG. 1 is a schematic cross-sectional view of an organic light-emitting device 100 according to an embodiment of the present disclosure.

The organic light-emitting device 100 includes a substrate 101, a first electrode 111, a hole injection layer 121, a first hole transport layer 122, a second hole transport layer 123, an emission layer 125, an electron transport layer 127, an electron injection layer 128, and a second electrode 131, which are on one another in the stated order (e.g., they are sequentially formed).

The substrate 101 may be any suitable substrate that is generally used in an organic light-emitting device according to the related art. The substrate 101 may be a glass or transparent plastic substrate that has mechanical strength, thermal stability, transparency, surface smoothness, ease of handling, and good repellency characteristics (e.g., good water repellency characteristics). In some embodiments, however, the substrate 101 may instead include (e.g., be formed of) a non-transparent material, such as silicon or stainless steel.

The first electrode 111 may be on (e.g., formed on) the substrate 101. The first electrode 111 may be an anode, and may include (e.g., be formed of) a material that has a relatively high work function. The first electrode 111 may include (e.g., be formed of), for example, a transparent conductive oxide, such as indium tin oxide (ITO), indium zinc oxide (IZO), zinc oxide (ZnO), Al-doped zinc oxide (AZO), indium oxide ($In_2O_3$), or tin oxide ($SnO_2$), but a material of the first electrode 111 is not limited thereto. The first electrode 111 may be formed by deposition or sputtering.

The hole injection layer 121 may be on (e.g., be formed on) the first electrode 111. The hole injection layer 121 may include (e.g., be formed of), for example, a phthalocyanine compound, such as copper phthalocyanine, N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4'4"-tris(N,N-diphenylamino)triphenylamine (TDATA), 4,4',4"-tris{N,-(2-naphthyl)-N-phenylamino}-triphenylamine (2T-NATA), 1,4,5,8,9,11-hexaazatriphenylene hexacarbonitrile (HATCN), poly(3,4-ethylenedioxythiophene)/poly(4-styrenesulfonate) (PEDOT/PSS), polyaniline/dodecylbenzenesulfonic acid (Pani/DBSA), polyaniline/camphor sulfonic acid (Pani/CSA), or polyaniline/poly(4-styrenesulfonate) (PANI/PSS), but the material of the hole injection layer 121 is not limited thereto.

The hole injection layer 121 may be formed by various suitable methods, such as vacuum deposition, spin coating, casting, langmuir-blodgett (LB) deposition, or the like.

When the hole injection layer 121 is formed by vacuum deposition, the vacuum deposition conditions may be adjusted according to the material used to form the hole injection layer 121 and the target characteristics of the hole injection layer 121. For example, the deposition temperature may be about 100° C. to about 500° C., the vacuum degree may be about $10^{-8}$ Torr to about $10^{-3}$ Torr, and the deposition speed may be about 0.01 Å/sec to about 100 Å/sec.

When the hole injection layer 121 is formed by spin coating, the coating conditions may vary according to the material used to form the hole injection layer 121 and the target characteristics of the hole injection layer 121. For example, the coating rate may be about 2000 rpm to about 5000 rpm, and the temperature at which heat treatment is performed to remove the solvent after coating may be about 80° C. to about 200° C.

A thickness of the hole injection layer 121 may be about 100 Å to about 10,000 Å, for example, about 100 Å to about 1,000 Å. When the thickness of the hole injection layer 121 is within any of the foregoing ranges, satisfactory (or suitable) hole injection characteristics may be obtained without a substantial increase in driving voltage.

In some embodiments, optionally, the hole injection layer 121 may be omitted (e.g., it may not be formed).

The first hole transport layer 122 may be on (e.g., formed on) the hole injection layer 121. The first hole transport layer 122 may include (e.g., be formed of), for example, a tertiary aryl amine compound, such as N,N'-bis(3-methylphenyl)-N, N'-diphenyl-[1,1-biphenyl]-4,4'-diamine (TPD), N,N'-di(1-naphthyl)-N,N'-diphenylbenzidine (NPB), N,N'-bis(naphthalen-2-yl)-N,N'-bis(phenyl)-benzidine (β-NPB), 4,4',4"-tris(N-carbazolyl)triphenylamine (TCTA), N,N'-bis (naphthalen-1-yl)-N,N'-bis(phenyl)-2,2'-dimethylbenzidine (α-NPD), 9,9-bis[4-(N,N-bis-naphthalen-2-yl-amino)phenyl]-9H-fluorene (NPAPF), 9,9-bis[4-(N-naphthalen-1-yl-N-phenylamino)-phenyl]-9H-fluorene (NPBAPF), N,N'-bis (phenanthren-9-yl)-N,N'-bis(phenyl)-benzidine (PAPB), di-[4-(N,N-ditolyl-amino)-phenyl]cyclohexane (TAPC), N,N, N',N'-tetra-naphthalen-2-yl-benzidine (β-TNB), N,N,N',N'-tetra-(3-methylphenyl)-3,3'-dimethylbenzidine (HMTPD), N,N'-di(naphthalenyl)-N,N'-di(naphthalen-2-yl)-benzidine (α,β-TNB), N,N,N',N'-tetra-naphthalenyl-benzidine (α-TNB), N,N'-di(naphthalen-2-yl)-N,N'-diphenylbenzene-1,4-diamine (β-NPP), $N^1,N^4$-diphenyl-$N^1,N^4$-dim-tolylbenzene-1,4-diamine (TTP), or $N^2,N^2,N^6,N^6$-tetraphenylnaphthalene-2,6-diamine (NDDP), but the first hole transport layer is not limited thereto.

The hole mobility of the first hole transport layer 122 may be about $10^{-4}$ to about $10^{-3}$ cm$^2$/V·s, and the electron mobility thereof may be about $5 \times 10^{-8}$ to about $5 \times 10^{-6}$ cm$^2$/V·s.

The first hole injection layer 122 may be formed by various methods, such as vacuum deposition, spin coating, casting, LB deposition, or the like. When the first hole transport layer 122 is formed by vacuum deposition or spin coating, the deposition or coating conditions may be similar to those described above for forming the hole injection layer 121, although the deposition or coating conditions may be adjusted according to the material that is used to form the first hole transport layer 122.

A thickness of the first hole injection layer 122 may be about 50 Å to about 1,000 Å, for example, about 100 Å to about 800 Å. When the thickness of the first hole transport layer 122 is within any of the foregoing ranges, the first hole transport layer 122 may have satisfactory (or suitable) hole transportation characteristics without a substantial increase in driving voltage.

The second hole transport layer 123 may be on (e.g., formed on) the first hole injection layer 122. The second hole transport layer 123 may include (e.g., be formed of) a dibenzo sulfide derivative compound, but the second hole transport layer is not limited thereto.

The hole mobility of the second hole transport layer 123 may be about 0.5 times to about 2 times greater than the hole mobility of the first hole transport layer 122, and the electron mobility of the second hole transport layer 123 may be about 5 times to about 100 times greater than the electron mobility of the first hole transport layer 122. The hole mobility of the second hole transport layer 123 may be about 10 times to about 1000 times greater than the electron mobility of the second hole transport layer 123. For example, the hole mobility of the second hole transport layer 123 may be about $10^{-4}$ to about $10^{-3}$ cm$^2$/V·s, and the electron mobility of the second hole transport layer 123 may be about $5 \times 10^{-6}$ to $1 \times 10^{-4}$ cm$^2$/V·s.

The thickness of the second hole transport layer 123 may be adjusted according to the emission color to adjust the resonance thickness of a microcavity. For example, the thickness of the second hole transport layer may correspond to a resonance distance of a wavelength of the emission light of the emission layer (e.g., the thickness of the second hole transport layer may be such that light having a wavelength of the emission light resonates in the microcavity). The thickness of the second hole transport layer 123 may be, for example, about 200 Å to about 1,500 Å, or, for example, about 400 Å to about 1,000 Å.

The hole mobility of the second hole transport layer 123 may be similar to that of the first hole transport layer 122, and the electron mobility of the second hole transport layer

123 may be substantially greater than that of the first hole transport layer 122. As used herein, the electron mobility of the second hole transport layer 123 being "substantially greater" than that of the first hole transport layer 122 refers to the electron mobility of the second hole transport layer 123 being about 5 times to about 100 times greater than the electron mobility of the first hole transport layer 122. Accordingly, when the thickness of a hole transport layer is increased to adjust the resonance thickness of the microcavity, an increase in driving voltage may be prevented (or reduced) due to the increase in electron mobility.

An emission layer (EML) 125 may be on (e.g., formed on) the second hole transport layer 123 by spin coating, casting, or LB deposition. When the EML 125 is formed by vacuum deposition or spin coating, the deposition or coating conditions may be similar to those described above for the formation of the hole injection layer 121, though the conditions for deposition or coating may be adjusted according to the material that is used to form the EML 125.

As the material for forming the EML 125, at least one material selected from any suitable emission materials (including a host and a dopant) generally used in the art may be used.

The host for use in the EML 125 may include, for example, tris(8-quinolinolate)aluminium ($Alq_3$), 4,4'-bis(N-carbazolyl)-1,1'-biphenyl, 4,4'-bis(N-carbazolyl)-1,1'-biphenyl (CBP), poly(n-vinylcarbazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBI), 3-tert-butyl-9,10-di(naphth-2-yl) anthracene (TBADN), distyrylarylene (DSA), E3, or 4,4'-bis(9-carbazolyl)-2,2'-dimethyl-biphenyl (CDBP), but the host is not limited thereto.

The dopant for use in the EML 125 may include any suitable dopant generally used in the art. The dopant may include at least one of a fluorescent dopant or a phosphorescent dopant. The phosphorescent dopant may include an organic metallic complex including Ir, Pt, Os, Re, Ti, Zr, Hf, or a combination of at least two of these, but the dopant is not limited thereto.

The red dopant may include Pt(II) octaethylporphine (PtOEP), tris(2-phenylisoquinoline)iridium ($Ir(piq)_3$), bis(2-(2'-benzothienyl)-pyridinato-N,C3')iridium(acetylacetonate) (Btp2Ir(acac)), or 2-(2-tert-butyl-6-((E)-2-(2,6,6-trimethyl-2,4,5,6-tetrahydro-1H-pyrrolo[3,2,1-ij]quinolin-8-yl)vinyl)-4H-pyran-4-ylidene)malononitrile (DCQTB), but the red dopant is not limited thereto.

The green dopant may include tris(2-phenylpyridine) iridium ($Ir(ppy)_3$), bis(2-phenylpyridine)(acetylacetonato) iridium (III) ($Ir(ppy)_2(acac)$), tris(2-(4-tolyl)phenylpyridine) iridium ($Ir(ppy)_3$), 10-(2-benzothiazolyl)-1,1,7,7-tetramethyl-2,3,6,7-tetrahydro-1H,5H,11H-[1]benzopyrao[6,7,8-ij]-quinolizin-1'-one (C545T), but the green dopant is not limited thereto.

The blue dopant may include bis[3,5-difluoro-2-(2-pyridyl)phenyl](picolinato)iridium(III) ($F_2Irpic$), ($F_2\ ppy)_2$ Ir(tmd), Ir(dfppz)$_3$, 4,4'-bis(2,2'-diphenylethen-1-yl)biphenyl (DPVBi), 4,4'-bis[4-(diphenylamino)styryl]biphenyl (DPAVBi), or 2,5,8,11-tetra-tert-butyl perylene (TBPe), but the blue dopant is not limited thereto.

When the EML 125 includes a host and a dopant, an amount of the dopant may be, generally, about 0.01 to about 15 parts by weight based on 100 parts by weight of the host, but the amount of the dopant is not limited thereto.

The thickness of the EML 125 may be about 100 Å to about 1,000 Å, for example, about 200 Å to about 600 Å. When the thickness of the EML 125 is within any of the foregoing ranges, good light-emission characteristics may be obtained without a substantial increase in driving voltage.

When a phosphorescent dopant is used in the EML 125, triplet excitons or holes may diffuse to the electron transport layer. To prevent (or reduce) the diffusion of excitons or holes, a hole blocking layer (HBL) may be between (e.g., formed between) the electron transport layer 127 and the EML 125 by vacuum deposition, spin coating, casting, LB deposition, or the like. When the HBL is formed by vacuum deposition or spin coating, the deposition or coating conditions may be similar to those discussed above for forming the hole injection layer 121, although the deposition or coating conditions may be adjusted according to the material that is used to form the HBL. A material for forming the HBL may be, for example, an oxadiazole derivative, a triazole derivative, or a phenanthroline derivative, but the material for the HBL is not limited thereto. For example, BCP may be used to form the HBL.

The thickness of the HBL may be about 50 Å to about 1,000 Å, for example, about 100 Å to about 300 Å. When the thickness of the HBL is within any of the foregoing ranges, the HBL may have good hole blocking characteristics without a substantial increase in driving voltage.

The electron transport layer 127 may be on (e.g., formed on) the EML 125. The electron transport layer 127 may include (e.g., be formed of), for example, $Alq_3$, 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), beryllium bis(benzoquinolin-10-olate) ($Bebq_2$), or 9,10-di(naphthalene-2-yl)anthracene (ADN), but the material of the electron transport layer 127 is not limited thereto.

The electron transport layer 127 may be formed by vacuum deposition, spin-coating, or casting. When the electron transport layer 127 is formed by vacuum deposition or spin coating, the deposition or coating conditions may be similar to those discussed above for forming the hole injection layer 121, although the deposition or coating conditions may be adjusted according to the material that is used to form the electron transport layer 127.

The thickness of the electron transport layer 127 may be about 100 Å to about 1,000 Å, for example, about 150 Å to about 500 Å. When the thickness of the electron transport layer 127 is within any of the foregoing ranges, the electron transport layer 127 may have satisfactory (or suitable) electron transportation characteristics without a substantial increase in driving voltage.

Also, the electron transport layer 127 may include an electron transport organic compound and a metal-containing material. The metal-containing material may include a Li complex. An example of the Li complex is lithium quinolate (LiQ), but the Li complex is not limited thereto.

The electron injection layer 128 may be on (e.g., formed on) the electron transport layer 127. The electron injection layer 128 may include any of various suitable materials that are generally used in the art as a material for forming an electron injection layer, and examples thereof include LiF, NaCl, CsF, $Li_2O$, and BaO, but the electron injection layer is not limited thereto. The electron injection layer 128 may be formed by, for example, vacuum deposition. A thickness of the electron injection layer 128 may be about 1 Å to about 100 Å, or about 5 Å to about 70 Å. When the thickness of the electron injection layer 128 is within any of the foregoing ranges, the electron injection layer 128 may have satisfactory (or suitable) electron transportation characteristics without a substantial increase in driving voltage.

The electron injection layer 128 may be formed by, for example, vacuum deposition. A thickness of the electron injection layer 128 may be about 1 Å to about 100 Å, or about 5 Å to about 70 Å. When the thickness of the electron injection layer 128 is within any of the foregoing ranges, the electron injection layer 128 may have satisfactory (or suitable) electron transportation characteristics without a substantial increase in driving voltage.

In some embodiments, the electron injection layer 128 may be omitted (e.g., not formed), and instead of the electron transport layer 127 and the electron injection layer 128, an electron functional layer having electron transport capabilities and electron injection capabilities may be included (e.g., formed).

The second electrode 131 may be on (e.g., formed on) the electron injection layer 128. The second electrode 131 may be a cathode, and may include (e.g., be formed of) a metal, an alloy, an electrically conductive compound, or a mixture thereof, each of which has a low work function, but the second electrode is not limited thereto. The second electrode 131 may include (e.g., be formed of), for example, lithium (Li), magnesium (Mg), aluminum (Al), aluminum-lithium (Al—Li), Calcium (Ca), magnesium-indium (Mg—In), or magnesium-silver (Mg—Ag). To obtain a top-emission type light-emitting device, a thin film including (e.g., formed of) the material may be used as a transmissive electrode, for example, ITO or IZO may be used to form the transmissive electrode. The second electrode 131 may be formed by, for example, vacuum deposition. The thickness of the second electrode 131 may be, for example, about 20 to about 300 Å or about 50 to about 200 Å.

Figure 2:
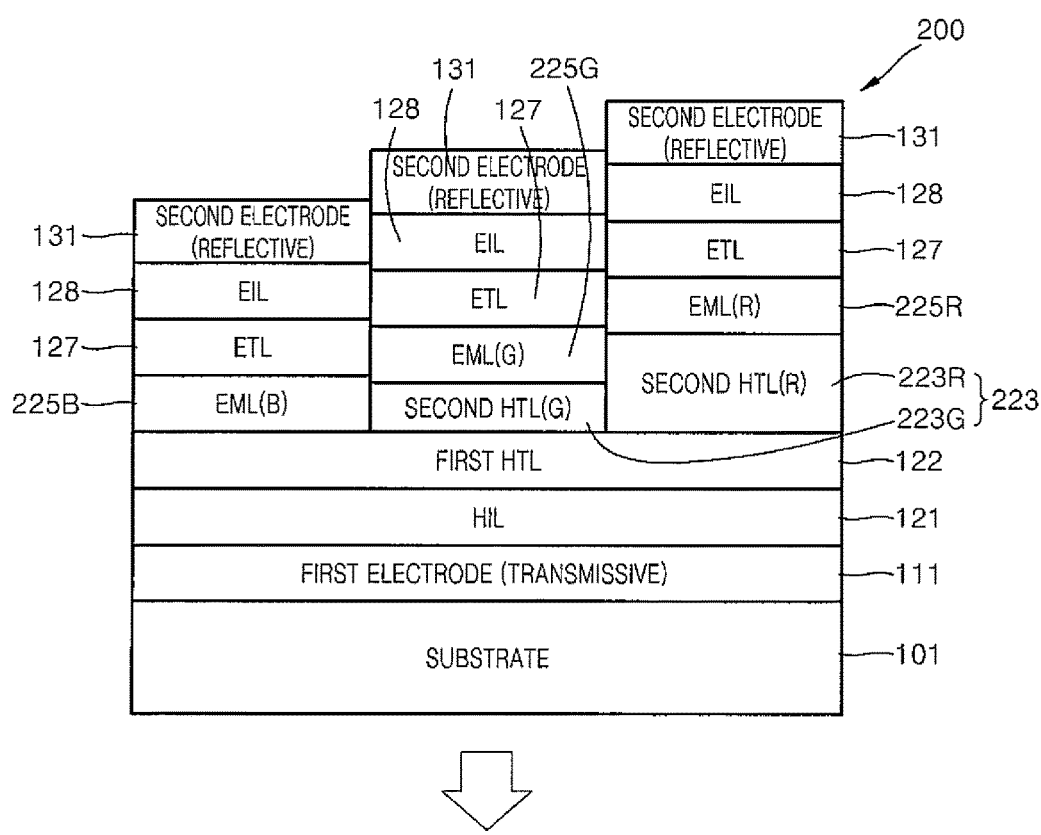
FIG. 2 is a schematic cross-sectional view of a structure of an organic light-emitting device according to another embodiment of the present disclosure.

FIG. 2 is a schematic cross-sectional view of an organic light-emitting device 200 according to another embodiment of the present disclosure. The organic light-emitting device 200 is a full color organic light-emitting device that includes a sub-pixel including a red emission region (R), a sub-pixel including a green emission region (G), and a sub-pixel including a blue emission region (B). The organic light-emitting device 200 is a bottom emission type light-emitting device in which light is emitted through a substrate.

Referring to FIG. 2, the organic light-emitting device 200 includes a substrate 101, a first electrode 111, a hole injection layer 121, a first hole transport layer 122, a second hole transport layer 223, an emission layer 225, an electron transport layer 127, an electron injection layer 128, and a second electrode 131, which are on one another in the stated order (e.g., they are sequentially formed in the stated order).

The second hole transport layer 223 includes a red-second hole transport layer 223R in the red emission region R and a green-second hole transport layer 223G in the green emission region G. The emission layer 225 includes a red emission layer 225R in the red emission region R, a green emission layer 225G in the green emission region G, and a blue emission layer 225B in the blue emission region B.

The substrate 101 is the same as that described above with reference to the embodiments of FIG. 1.

The first electrode 111 may be an anode, and may include (e.g., be formed of) a material that has a relatively high work function. Because the organic light-emitting device 200 is a bottom emission type device, the first electrode 111 may include (e.g., be formed of) a transparent material. The first electrode 111 may include (e.g., be formed of), for example, a transparent conductive oxide, such as ITO, IZO, ZnO, AZO, In$_2$O$_3$, or SnO$_2$, but the material for forming the first electrode 111 is not limited thereto.

Materials for forming the hole injection layer 121, the first hole transport layer 122, and the red- and green-second hole transport layers 223R and 223G are the same as those described above with reference to the embodiments of FIG. 1. In some embodiments, the red-second hole transport layer 223R and the green-second hole transport layer 223G may include (e.g., be formed of) identical (or substantially identical) materials.

A thickness of the first hole injection layer 122 may be about 50 Å to about 1,000 Å, for example, about 100 Å to about 800 Å.

The thickness of the second hole transport layer 223 may be adjusted according to the emission region to adjust the resonance thickness of the microcavity. In some embodiments, only the red and green emission regions (R and G) of the organic light-emitting device 200 include a second hole transport layer. The red-second hole transport layer 223R in the red emission region R may have a thickness of, for example, about 500 Å to about 1,500 Å, and the green-second hole transport layer 223G in the green emission region G may have a thickness of, for example, about 200 Å to about 1,000 Å.

The emission layer 225 is the same as the EML 125 described with reference to the embodiment of FIG. 1. The electron transport layer 127 and the electron injection layer 128 are the same as those described above with reference to the embodiments of FIG. 1.

The cathode 131 may be on (e.g., formed on) the electron injection layer 128. The cathode 131 may include (e.g., be formed of) a metal, an alloy, an electrically conductive compound, or a mixture thereof, each of which has a low work function, but the cathode is not limited thereto. The cathode 131 may include (e.g., be formed of), for example, lithium (Li), magnesium (Mg), aluminum (Al), aluminum-lithium (Al—Li), potassium (Ca), magnesium-indium (Mg—In), or magnesium-silver (Mg—Ag). The thickness of the cathode 131 may be, for example, about 20 to about 300 Å or about 50 to about 200 Å.

Figure 3:
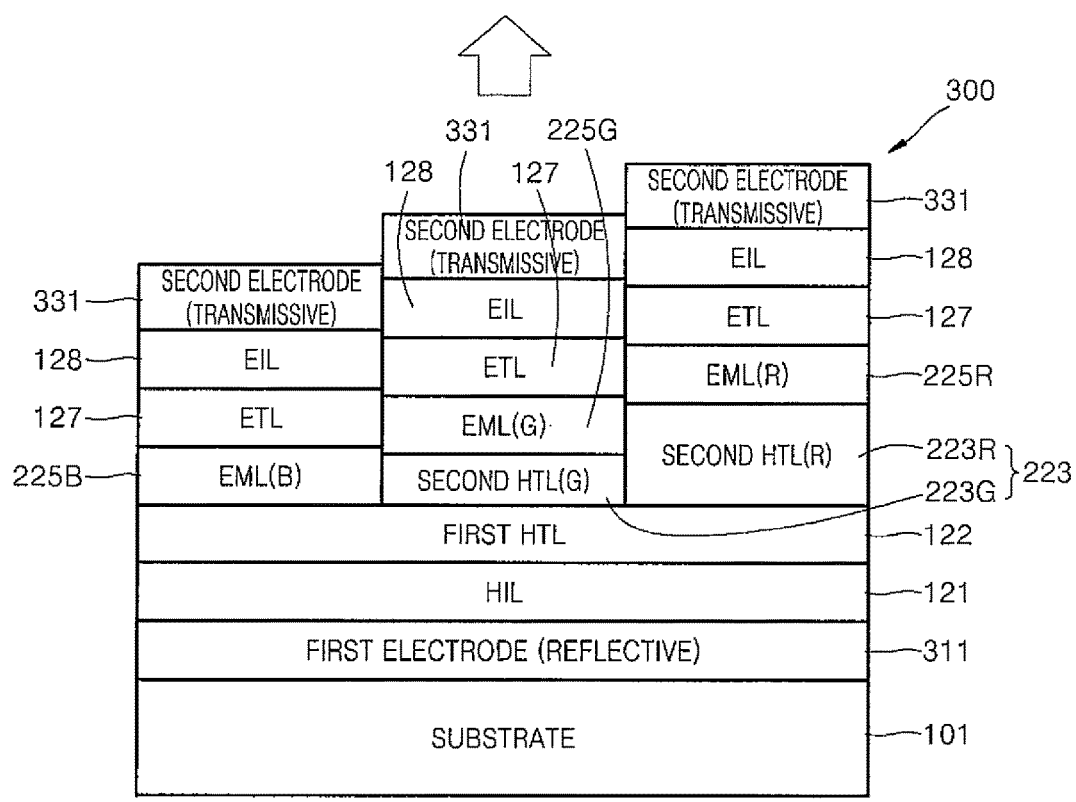
FIG. 3 is a schematic cross-sectional view of a structure of an organic light-emitting device according to another embodiment of the present disclosure.

FIG. 3 is a schematic cross-sectional view of an organic light-emitting device 300 according to another embodiment of the present disclosure. The organic light-emitting device 300 is a full color organic light-emitting device that includes a sub-pixel including a red emission region (R), a sub-pixel including a green emission region (G), and a sub-pixel including a blue emission region (B). The organic light emitting device 300 is a top emission type light-emitting device in which light is emitted through a second electrode.

Referring to FIG. 3, the organic light-emitting device 300 includes a substrate 101, a first electrode 311, a hole injection layer 121, a first hole transport layer 122, a second hole transport layer 223, an emission layer 225, an electron transport layer 127, an electron injection layer 128, and a second electrode 331, which are on one another in the stated order (e.g., they are sequentially formed in the stated order).

The second hole transport layer 223 includes a red-second hole transport layer 223R in the red emission region R and a green-second hole transport layer 223G in the green emission region G. The emission layer 225 includes a red emission layer 225R in the red emission region R, a green emission layer 225G in the green emission region G, and a blue emission layer 225B in the blue emission region B.

The organic light-emitting device 300 of FIG. 3 is distinguished from the organic light-emitting device 200 in that, for example, the organic light-emitting device 300 is a top emission type light-emitting device and the organic light-emitting device 200 is a bottom emission type light-emitting device.

In FIG. 3, the first electrode 311 may be an anode, and because the organic light-emitting device 300 is a top emission type light-emitting device, the first electrode 311 may be formed of a reflective material. The first electrode 311 may include (e.g., be formed of), for example, a reflective metal material, such as Ag, Ag/AgOx, Ag/MnOx, or Ag/CFx, but the first electrode is not limited thereto. The first electrode 311 may be a double layer including a reflective film and a transparent conductive film. The reflective film may include, for example, an aluminium film, a silver film, an aluminium alloy film, or a silver alloy film, but the reflective film is not limited thereto. The transparent conductive film may include (e.g., be formed of), for example, a transparent conductive oxide, such as ITO, IZO, ZnO, AZO, $In_2O_3$, or $SnO_2$, but the transparent conductive film is not limited thereto.

The substrate 101, the hole injection layer 121, the first hole transport layer 122, the red-second hole transport layer 223R, the green-second hole transport layer 223G, the electron transport layer 127, and the electron injection layer 128 may be the same as those described above with reference to the embodiment of FIG. 2.

The second electrode 331 may be on (e.g., formed on) the electron injection layer 128. The second electrode 331 may be a cathode, and because the organic light-emitting device 300 is a top emission type light-emitting device, the second electrode 331 may include (e.g., be formed of) a transmissive material. The second electrode 331 may include (e.g., be formed of), for example, Mg, Ca, Al, Ag, Ba, or an alloy thereof, and may have a thickness that allows light to pass therethrough.

The structures illustrated in FIGS. 2 and 3 are provided for illustration only and the present disclosure is not limited thereto. For example, although the red-emission layer 225R in the red emission region R, the green-emission layer 225G in the green emission region G, and the blue-emission layer 225B in the blue emission region B (illustrated in FIGS. 2 and 3) contact each other, the red-emission layer 225R, the green-emission layer 225G, and the blue emission region B may be insulated (e.g., electrically insulated) from each other. Also, the electron transport layer 127, the electron injection layer 128, and the second electrodes 131 and 331, similarly to the hole injection layer 121 or the first hole transport layer 122, may be formed as a common layer with respect to the respective emission regions.

An organic light-emitting device according to an embodiment of the present disclosure may be an organic light-emitting device having a substrate/anode/hole injection layer/first hole transport layer/second hole transport layer/emission layer/electron transport layer/electron injection layer/cathode structure or an organic light-emitting device having a substrate/cathode/electron injection layer/electron transport layer/emission layer/second hole transport layer/first hole transport layer/hole injection layer/anode structure. Furthermore, an organic light-emitting device according to an embodiment of the present disclosure may be a top emission type organic light-emitting device or a bottom emission type organic light-emitting device. An organic light-emitting device according to an embodiment of the present disclosure may additionally include layers for the injection or transport of electrons or holes or for the prevention of diffusion of excitons (or to reduce the diffusion of excitons).

Hole Mobility and Electron Mobility

Figure 4:
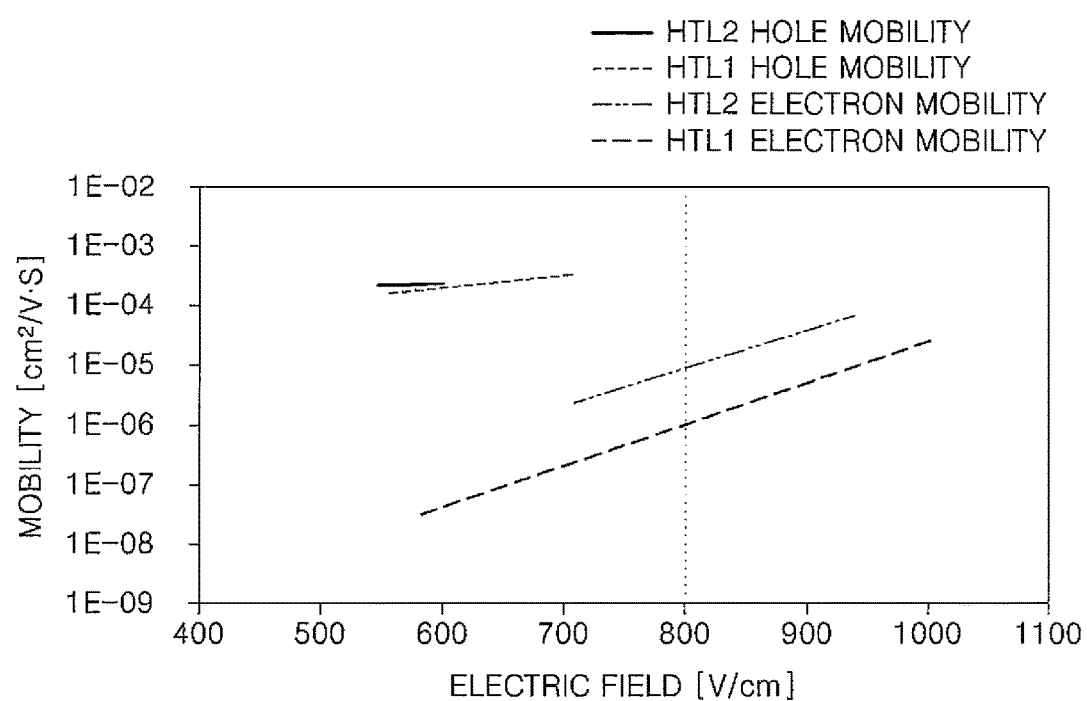
FIG. 4 is a graph showing hole mobility and electron mobility of a first hole transport layer material and a second hole transport layer material in an electric field, which were measured according to the Example and Comparative Example.

FIG. 4 is a graph showing hole mobility and electron mobility of NPB, which may be a first hole transport layer material, and di(benzo[b]phosphole sulfide) (DBPSB), which may be a second hole transport layer material, in an electric field. In FIG. 4, the hole mobility of the second hole transport layer material (DBPSB; shown in FIG. 4 as HTL2 HOLE MOBILITY) is almost similar to the hole mobility of the first hole transport layer material (NPB; shown in FIG. 4 as HTL1 HOLE MOBILITY), and the electron mobility of the second hole transport layer material (DBPSB; shown in FIG. 4 as HTL2 ELECTRON MOBILITY) is 10 times as high as that of the first hole transport layer material (NPB; shown in FIG. 4 as HTL2 ELECTRON MOBILITY).

Example

A 15 $\Omega/cm^2$ (1,200 Å thick) ITO layer on a glass substrate, manufactured by Corning Company, was sonicated by using isopropyl alcohol and pure water for 5 minutes each, and then, washed by exposure to ultraviolet ozone (i.e., using an ultraviolet ozone generator) for 30 minutes to form the substrate with an anode thereon. HATCN was vacuum deposited on the ITO glass substrate to form a hole injection layer having a thickness of 30 Å, and NPB was vacuum deposited on the hole injection layer to form a first hole transport layer having a thickness of 700 Å. Di(benzo[b]phosphole sulfide) (DBPSB) was vacuum deposited on the first hole transport layer to form a second hole transport layer having a thickness of 650 Å. An emission layer having a thickness of 450 Å and including 99 wt. % $Alq_3$ as a red host and 1 wt. % DCQTB as a red dopant, was formed on the second hole transport layer. $Alq_3$ was vacuum deposited on the emission layer to form an electron transport layer having a thickness of 250 Å. LiF was vacuum deposited on the electron transport layer to form an electron injection layer having a thickness of 20 Å, and then, Al was vacuum deposited thereon to form a cathode having a thickness of 1000 Å, thereby manufacturing an organic light-emitting device.

Comparative Example

An organic light-emitting device was manufactured as in the Example except that the first hole transport layer was formed to have a thickness of 1,350 Å, and the second hole transport layer was not formed.

Measurement

Table 1 shows driving voltages, instantaneous brightness, instantaneous efficiency, and power efficiency of the organic light-emitting devices manufactured according to the Example and Comparative Example, which were measured at a current density of 1000 $mA/cm^2$.

TABLE 1

| | Driving voltage (V) | Instantaneous brightness [$cd/m^2$] | Instantaneous efficiency (cd/A) | Power efficiency [lm/W] | CIEx | CIEy |
| --- | --- | --- | --- | --- | --- | --- |
| Example | 7.4 | 106,700 | 10.7 | 4.5 | 0.666 | 0.333 |
| Comparative Example | 8.1 | 109,400 | 10.9 | 4.2 | 0.667 | 0.331 |

The organic light-emitting device of the Example is almost equivalent to the organic light-emitting device of the Comparative Example in terms of instantaneous brightness and instantaneous efficiency, while the driving voltage of the organic light-emitting device of the Example was lower than that of the organic light-emitting device of the Comparative Example by 0.7 V.

According to embodiments of the present disclosure, a material having high electron mobility is included in (e.g., used in forming) a hole transport layer to adjust a resonance distance in a microcavity structure to increase mobility of electrons in a device including the hole transport layer, thereby leading to a decrease in a driving voltage of the device.

It should be understood that the embodiments described herein should be considered in a descriptive sense only and not for purposes of limitation. Descriptions of features or aspects within each embodiment should typically be considered as available for other similar features or aspects in other embodiments.

While certain embodiments of the present disclosure have been described with reference to the figures, it will be understood by those of ordinary skill in the art that various changes may be made the disclosed embodiments without departing from the spirit and scope of the present invention as defined by the following claims, and equivalents thereof.

What is claimed is:

1. An organic light-emitting device having a resonance structure, the organic light-emitting device comprising:
   a substrate;
   a first electrode and a second electrode on the substrate and facing each other;
   an emission layer between the first electrode and the second electrode;
   a first hole transport layer between the first electrode and the emission layer; and
   a second hole transport layer between the first hole transport layer and the emission layer,
   the second hole transport layer comprising a dibenzo sulfide derivative,
   an electron mobility of the second hole transport layer being 5 times to 100 times greater than an electron mobility of the first hole transport layer, and a thickness of the second hole transport layer corresponding to a resonance distance of a wavelength of emission light of the emission layer.

2. The organic light-emitting device of claim 1, wherein a hole mobility of the second hole transport layer is 0.5 times to 2 times greater than a hole mobility of the first hole transport layer.

3. The organic light-emitting device of claim 1, wherein a hole mobility of the second hole transport layer is 10 times to 1,000 times greater than the electron mobility of the second hole transport layer.

4. The organic light-emitting device of claim 3, wherein the first hole transport layer comprises N,N'-bis(3-methylphenyl)-N,N'-diphenyl-[1,1-biphenyl]-4,4'-diamine (TPD), N,N'-di(1-naphthyl)-N,N'-diphenylbenzidine (NPB), N,N'-bis(naphthalen-2-yl)-N,N'-bis(phenyl)-benzidine (β-NPB), 4,4',4''-tris(N-carbazolyl)triphenylamine (TCTA), N,N'-bis(naphthalen-1-yl)-N,N'-bis(phenyl)-2,2'-dimethylbenzidine (α-NPD), 9,9-bis[4-(N,N-bis-naphthalen-2-yl-amino)phenyl]-9H-fluorene (NPAPF), 9,9-bis[4-(N-naphthalen-1-yl-N-phenylamino)-phenyl]-9H-fluorene (NPBAPF), N,N'-bis(phenanthren-9-yl)-N,N'-bis(phenyl)-benzidine (PAPB), di-[4-(N,N-ditolyl-amino)-phenyl]cyclohexane (TAPC), N,N,N',N'-tetra-naphthalen-2-yl-benzidine (β-TNB), N,N,N',N'-tetra-(3-methylphenyl)-3,3'-dimethylbenzidine (HMTPD), N,N'-di(naphthalenyl)-N,N'-di(naphthalen-2-yl)-benzidine (α,β-TNB), N,N,N',N'-tetra-naphthalenyl-benzidine (α-TNB), N,N'-di(naphthalen-2-yl)-N,N'-diphenylbenzene-1,4-diamine (β-NPP), $N^1,N^4$-diphenyl-$N^1,N^4$-dim-tolylbenzene-1,4-diamine (TTP), or $N^2,N^2,N^6,N^6$-tetraphenylnaphthalene-2,6-diamine (NDDP).

5. The organic light-emitting device of claim 1, further comprising an electron transport layer between the emission layer and the second electrode, and an electron injection layer between the electron transport layer and the second electrode.

6. The organic light-emitting device of claim 1, further comprising a hole injection layer between the first electrode and the first hole transport layer.

7. An organic light-emitting device having a resonance structure, the organic light-emitting device comprising:
   a substrate;
   a first electrode and a second electrode on the substrate and facing each other;
   an emission layer between the first electrode and the second electrode;
   a first hole transport layer between the first electrode and the emission layer; and
   a second hole transport layer between the first hole transport layer and the emission layer,
   the second hole transport layer comprising di(benzo[b] phosphole sulfide) (DBPSB),
   an electron mobility of the second hole transport layer being 5 times to 100 times greater than an electron mobility of the first hole transport layer, and
   a thickness of the second hole transport layer corresponding to a resonance distance of a wavelength of emission light of the emission layer.

8. An organic light-emitting device comprising a first pixel region, a second pixel region, and a third pixel region, and having a resonance structure, the organic light-emitting device comprising:
   a substrate;
   a first electrode and a second electrode on the substrate and facing each other;
   an emission layer between the first electrode and the second electrode and comprising a first emission layer in the first pixel region, a second emission layer in the second pixel region, and a third emission layer in the third pixel region;
   a first hole transport layer between the first electrode and the emission layer; and
   a second hole transport layer between the first hole transport layer and the emission layer, the second hole transport layer comprising a dibenzo sulfide derivative, and comprising a first pixel-second hole transport layer in the first pixel region and a second pixel-second hole transport layer in the second pixel region,
   an electron mobility of the second hole transport layer being 5 times to 100 times greater than an electron mobility of the first hole transport layer.

9. The organic light-emitting device of claim 8, wherein a hole mobility of the second hole transport layer is 0.5 times to 2 times greater than a hole mobility of the first hole transport layer.

10. The organic light-emitting device of claim 8, wherein a hole mobility of the second hole transport layer is 10 times to 1000 times as high as an electron mobility of the second hole transport layer.

11. The organic light-emitting device of claim 8, wherein the first hole transport layer comprises N,N'-bis(3-methylphenyl)-N,N'-diphenyl-[1,1-biphenyl]-4,4'-diamine (TPD), N,N'-di(1-naphthyl)-N,N'-diphenylbenzidine (NPB), N,N'-bis(naphthalen-2-yl)-N,N'-bis(phenyl)-benzidine (β-NPB), 4,4',4''-tris(N-carbazolyl)triphenylamine (TCTA), N,N'-bis (naphthalen-1-yl)-N,N'-bis(phenyl)-2,2'-dimethylbenzidine (α-NPD), 9,9-bis[4-(N,N-bis-naphthalen-2-yl-amino)phenyl]-9H-fluorene (NPAPF), 9,9-bis[4-(N-naphthalen-1-yl-N-phenylamino)-phenyl]-9H-fluorene (NPBAPF), N,N'-bis (phenanthren-9-yl)-N,N'-bis(phenyl)-benzidine (PAPB), di-[4-(N,N-ditolyl-amino)-phenyl]cyclohexane (TAPC), N,N,N',N'-tetra-naphthalen-2-yl-benzidine (β-TNB), N,N,N',N'-tetra-(3-methylphenyl)-3,3'-dimethylbenzidine (HMTPD), N,N'-di(naphthalenyl)-N,N'-di(naphthalen-2-yl)-benzidine (α,β-TNB), N,N,N',N'-tetra-naphthalenyl-benzidine (α-TNB), N,N'-di(naphthalen-2-yl)-N,N'-diphenylbenzene-1,4-diamine (β-NPP), $N^1,N^4$-diphenyl-$N^1,N^4$-dim-tolylbenzene-1,4-diamine (TTP), or $N^2,N^2,N^6,N^6$-tetraphenylnaphthalene-2,6-diamine (NDDP).

12. The organic light-emitting device of claim 8, wherein the first pixel region is a red emission pixel region, the second pixel region is a green emission pixel region, and the third pixel region is a blue emission pixel region.

13. The organic light-emitting device of claim 8, wherein a thickness of the first pixel-second hole transport layer corresponds to a resonance distance of a wavelength of emission light of the first pixel region, and a thickness of the second pixel-second hole transport layer corresponds to a resonance distance of a wavelength of emission light of the second pixel region.

14. The organic light-emitting device of claim 8, wherein the first electrode is a transmissive electrode and the second electrode is a reflective electrode.

15. The organic light-emitting device of claim 8, wherein the first electrode is a reflective electrode and the second electrode is a transmissive electrode.

16. The organic light-emitting device of claim 8, further comprising an additional layer between the emission layer and the second electrode, the additional layer being selected from the group consisting of an electron transport layer, an electron injection layer, an electron functional layer having an electron injection capability and an electron transport capability, and combinations thereof.

17. An organic light-emitting device comprising a first pixel region, a second pixel region, and a third pixel region, and having a resonance structure, the organic light-emitting device comprising:
   a substrate;
   a first electrode and a second electrode on the substrate and facing each other;
   an emission layer between the first electrode and the second electrode and comprising a first emission layer in the first pixel region, a second emission layer in the second pixel region, and a third emission layer in the third pixel region;
   a first hole transport layer between the first electrode and the emission layer; and
   a second hole transport layer between the first hole transport layer and the emission layer, the second hole transport layer comprising di(benzo[b]phosphole sulfide), and comprising a first pixel-second hole transport layer in the first pixel region and a second pixel-second hole transport layer in the second pixel region,
   an electron mobility of the second hole transport layer being 5 times to 100 times greater than an electron mobility of the first hole transport layer.

* * * * *